US007791054B2

(12) United States Patent
Ghildyal et al.

(10) Patent No.: US 7,791,054 B2
(45) Date of Patent: Sep. 7, 2010

(54) PHOTO CONTROLLER FOR SWITCHING A LOAD IN A HAZARDOUS ENVIRONMENT

(75) Inventors: Subodh K. Ghildyal, Chesterfield, MO (US); John Gold, Johnson City, NY (US); Kathleen Ann Gold, legal representative, Johnson City, NY (US)

(73) Assignee: Hubbell Incorporated, Shelton, CT (US)

( * ) Notice: Subject to any disclaimer, the term of this patent is extended or adjusted under 35 U.S.C. 154(b) by 1302 days.

(21) Appl. No.: 11/301,260

(22) Filed: Dec. 13, 2005

(65) Prior Publication Data

US 2006/0158042 A1 Jul. 20, 2006

Related U.S. Application Data

(60) Provisional application No. 60/634,983, filed on Dec. 13, 2004.

(51) Int. Cl.
*G02B 27/00* (2006.01)

(52) U.S. Cl. .................. 250/551; 307/117; 307/125

(58) Field of Classification Search ............ 250/551; 307/117, 141, 141.4, 141.8, 112, 113, 116, 307/125

See application file for complete search history.

(56) References Cited

U.S. PATENT DOCUMENTS

| 3,584,222 | A | 6/1971 | Nesbitt | 250/214 |
|---|---|---|---|---|
| 3,601,614 | A | 8/1971 | Platzer, Jr. | 250/209 |
| 3,621,356 | A | 11/1971 | On | 318/480 |
| 3,767,924 | A | 10/1973 | Charles et al. | 250/209 |
| 3,790,848 | A | 2/1974 | Lai | 315/155 |
| 3,975,643 | A | 8/1976 | Toth | 250/551 |
| 4,009,387 | A | 2/1977 | Nuver | 250/205 |
| 4,091,276 | A | 5/1978 | Lebovici | 250/214 |
| 4,352,998 | A | 10/1982 | Baker et al. | 307/311 |
| 4,498,019 | A | 2/1985 | Berger | 307/132 |
| 4,587,459 | A | 5/1986 | Blake | 315/158 |

(Continued)

OTHER PUBLICATIONS

"Hazardous Location Photocontrols, Factory Sealed"; F1-142, Appleton Electric Company, Oct. 2002, p. 142.

(Continued)

*Primary Examiner*—Georgia Y Epps
*Assistant Examiner*—Tony Ko
(74) *Attorney, Agent, or Firm*—Stacey J. Longanecker; Mark S. Bicks; Alfred N. Goodman

(57) ABSTRACT

A photo controller circuit for use in hazardous areas has an output switching (OS) circuit comprising an alternistor for ON/OFF switching of a load, and an optoisolator for gating the alternistor. A light to voltage converter (LVC) circuit generates a DC voltage proportional to detected incident light. A hysteresis control (HS) circuit comprises a voltage comparator for generating an output depending on the DC voltage and the state of the OS circuit. An integrator and switching (IS) circuit turns on and activates the optoisolator when the output of the HC circuit indicates the detected incident light is below a selected level, and turns off and deactivates the optoisolator when the output of the HC circuit indicates the detected incident light is above a selected level. The IS circuit time delays the output of the HC circuit prior activating or deactivating the optoisolator. The electronic components are rated for 125° C.

25 Claims, 1 Drawing Sheet

U.S. PATENT DOCUMENTS

| | | | |
|---|---|---|---|
| 4,647,763 A | 3/1987 | Blake | 250/214 |
| 4,651,023 A | 3/1987 | Parsonage | 307/117 |
| 4,658,129 A | 4/1987 | Fan | 250/214 |
| RE32,450 E | 6/1987 | Blake | 315/158 |
| 4,745,311 A * | 5/1988 | Iwasaki | 327/428 |
| 4,758,767 A | 7/1988 | Blake | 315/158 |
| 4,800,293 A | 1/1989 | Miller | 307/117 |
| 4,864,126 A * | 9/1989 | Walters et al. | 250/551 |
| 5,013,904 A | 5/1991 | Muro | 250/214 |
| 5,057,700 A * | 10/1991 | Choi | 307/125 |
| 5,257,639 A | 11/1993 | Prescott et al. | 137/82 |
| 5,448,056 A | 9/1995 | Tsuruta | 250/214 |
| 5,592,033 A * | 1/1997 | Gold | 307/117 |
| 5,808,423 A | 9/1998 | Li et al. | 315/313 |
| 5,892,331 A | 4/1999 | Hollaway | 315/159 |
| 5,892,642 A | 4/1999 | Watanabe | 340/644 |
| 6,011,329 A | 1/2000 | McGovern | 307/141.4 |
| 6,160,352 A | 12/2000 | Steinel | 315/156 |
| 6,222,283 B1 | 4/2001 | Regla | 307/117 |

OTHER PUBLICATIONS

"Intrinsic Safety Circuit Design Part 4—Digital Inputs-Switching Circuits", 4 pages printed on Jun. 20, 2005, http:\\www.crouse-hinds.com.

"Intrinsic Safety Circuit Design Part 5—Intrinsically Safe Outputs Made Easy", 5 pages printed on Jun. 20, 2005, http:\\www.crouse-hinds.com.

* cited by examiner

PHOTO CONTROLLER FOR SWITCHING A LOAD IN A HAZARDOUS ENVIRONMENT

This application claims the benefit of U.S. Provisional Patent Application Ser. No. 60/634,983, filed Dec. 13, 2004.

FIELD OF THE INVENTION

The invention relates generally to a photo-controller switching circuit, and more particularly, to a photocell-enabled switching circuit suitable for switching a load on or off, depending on ambient light conditions, in hazardous environments.

BACKGROUND OF THE INVENTION

It is often necessary to install electrical equipment in hazardous areas such as areas that contain explosive gases or dusts. In hazardous areas such as explosive environments, any source of energy can cause an explosion when flammable gases or combustible dusts are mixed in proper proportion with air. Equipment such as electrical switching circuits having moving parts (e.g., relays) can produce arcs or sparks in normal operation (i.e., when contacts are opened and closed) that can easily cause ignition of flammable gases or combustible dusts. Further, any device that produces heat can produce surface temperatures, which may exceed safe limits of a flammable atmosphere and result in ignition.

Most hazardous areas require lighting, and electrical circuits are needed to control lighting fixtures used in such locations. A typical switching circuit used to control the ON/OFF operation of such lighting fixtures includes a photocell, which responds to ambient light so that the lamp is turned ON only when insufficient ambient light exists in the hazardous location. Because of their insensitivity to noise, photocells have been used in hazardous environments wherein explosion-proof enclosures are typically required. Conventional photocell switching circuits used in hazardous locations, however, use photocells in conjunction with an electro-mechanical relay to provide a switching function. Thus, the potential for arcing and sparks generated by an electro-mechanical relay requires that the electro-mechanical relay be housed in an approved enclosure separate from or integrated with the photocell. The need for an electro-mechanical relay housed in an explosion-proof enclosure results in added switching circuit complexity. Further, the explosion-proof enclosure needed to house the electro-mechanical relay requires external seals, and is costly to manufacture.

U.S. Pat. No. 5,592,033, to Gold, discloses a switching circuit for use in hazardous environments that comprises no movable parts such as electromechanical relays and is relatively immune to noise to allow for enclosure of its components in a single unit, explosion proof housing. Its components, however, are complex. Further, the switching circuit is limited in terms of the ranges of voltages supported in the unit, that is, only 208-240 volts are supported. A need exists for a switching circuit suitable for use in a hazardous environment that has more simplified circuitry and can support a larger range of input voltages.

U.S. Pat. No. 4,658,129, to Fan, discloses a general purpose photoelectric control device, which includes a trigger unit 2. The trigger unit 2 includes a silicon controlled rectifier (SCR) 21 having a gate G2 connected to a photoelectric sensing element 13 of a sensing unit 1 via a capacitor 22. A first switching unit 3 supplies a rectified voltage to the sensing unit 1. A second switching unit 4 includes a TRIAC 41 which turns a load unit 5 on and off in response to light intensity changes detected by the sensing unit 1. The general purpose photoelectric control device of U.S. Pat. No. 4,658,129, however, is unsuitable for use in hazardous locations. For example, the switching devices of this patent (e.g., SCR 21 and TRIAC 41) are temperature dependent devices (i.e., their switching threshold fluctuates with changes in temperature). The control device of this patent is analog in nature (i.e., the SCR 21 is gated with an analog signal) and is only calibrated, if at all, for use with a specific temperature (i.e., no temperature compensation is provided). Further, the disclosed control device is only useable with a limited input voltage range (i.e., no voltage regulation is provided).

U.S. Pat. No. 6,160,352, to Steinel, discloses a switching deice for a fluorescent lamp that employs a light sensing element to activate or deactivate the lamp depending on whether the output of the light sensing element exceeds or falls below a reference threshold generator. The switching device employs a delay that is triggered only by the switching on of the lamp to ensure switching operation unaffected by the light emitted from the lamp. The components of the switching device disclosed in U.S. Pat. No. 6,160,352, to Steinel, cannot withstand the harsh conditions of a hazardous environment such as operation at 90 degrees C. ambient without degradation of performance. Further, the delay does not facilitate the prevention of errant switching off of the lamp.

Accordingly, a need exists for a less complex, more cost-effective switching circuit suitable for high temperature operation in hazardous environments. For example, such a switching circuit should be useable in high intensity discharge (HID) lighting wherein electrical components of the switching circuit are suitable for operation at 90 degrees Celsius ambient without degradation of performance. Further, it would be desirable to provide a switching circuit which operates independently of temperature variations and which is useable with a wide range of voltage inputs. In addition, it would be desirable to provide a switching circuit that is not susceptible to false tripping or errant switching of the load (e.g., switching the load on or off erroneously due to fluctuations in lighting or operating conditions that are unrelated to ambient light conditions and the selected thresholds for desired activation and deactivation of the load).

SUMMARY OF THE INVENTION

In accordance with an aspect of the present invention, a load switching circuit is provided for use in hazardous environments that has no movable electrical components (e.g., electromechanical relays) that are susceptible to arcing or sparks. The photo controller circuit is preferably implemented to operate in high ambient temperatures and, specifically, to 90 degrees Celsius (C.) by employing electronic components rated for 125° C.

In accordance with an exemplary embodiment of the present invention, a photo controller circuit comprises an output switching (OS) circuit having an alternistor for controllably completing and interrupting a power supply path between a power source and a load, and an optoisolator connected to the power source and to the alternistor for controllably gating the alternistor. A light to voltage converter (LVC) circuit detects incident light and generates a direct current (DC) voltage proportional to the detected incident light. A hysteresis control (HC) circuit comprises a voltage comparator for generating an output depending on the DC voltage and the state of the OS circuit. The state of the OS circuit is one of active to power on the load and inactive to power down the load. An intermediate switching (IS) circuit controllably turns on and provides current to activate the optoisolator when the output of the HC circuit indicates the detected incident light is below a first selected level and the IS circuit was off, and controllably turns off and reduces the current to deactivate the optoisolator when the output of the HC circuit indicates the detected incident light is above a second selected level and the IS circuit was on.

In accordance with an aspect of the present invention, the IS circuit ignores the output of the HC circuit and remains on when the output of the HC circuit indicates the detected incident light is below the first selected level and the IS circuit was on, and ignores the output of the HC circuit and remains off when the output of the HC circuit indicates the detected incident light is above the second selected level and the IS circuit was off.

In accordance with another aspect of the present invention, the first selected level is approximately two foot candles, and the second selected level is approximately 10 foot candles.

In accordance with yet another aspect of the present invention, the optoisolator is a triac output optoisolator having a light sensitive triac and light emitting diode (LED), wherein the current from the IS circuit forward biases the LED, and the light sensitive triac allows AC current to flow to the alternistor when it detects light from the LED and actuates.

In accordance with another aspect of the present invention, the optoisolator has a zero-crossing detector that actuates the light sensitive triac when zero-crossing of an AC voltage input from the power source is detected.

In accordance with an aspect of the present invention, the voltage comparator in the HC circuit has a set point and is operable to compare the DC voltage with the set point, the set point varying depending on the state of the voltage comparator.

In accordance with another aspect of the present invention, the photo controller circuit further comprises a power supply circuit connected to the power source and configured to provide a regulated voltage to at least one of the OS circuit, the LVC circuit, the HC circuit, and the IS circuit. The power supply circuit comprises variable components to configure the photo controller circuit for use with 120 volt and 347 volt input voltages from the power source, as well as for special wide range circuitry handling of input voltages from 208 through 277 volts. All embodiments of the present invention preferably operate at a frequency of either 50 or 60 Hertz.

In accordance with yet another aspect of the present invention, the IS circuit is configured to provide a selected time delay to the output of the HC circuit prior to generating the current to activate the optoisolator and prior to reducing the current to deactivate the optoisolator.

BRIEF DESCRIPTION OF THE DRAWINGS

The present invention can be further understood with reference to the following description and the appended drawings, wherein like elements are provided with the same reference numerals.

DETAILED DESCRIPTION OF THE EXEMPLARY EMBODIMENTS

Figure 1:
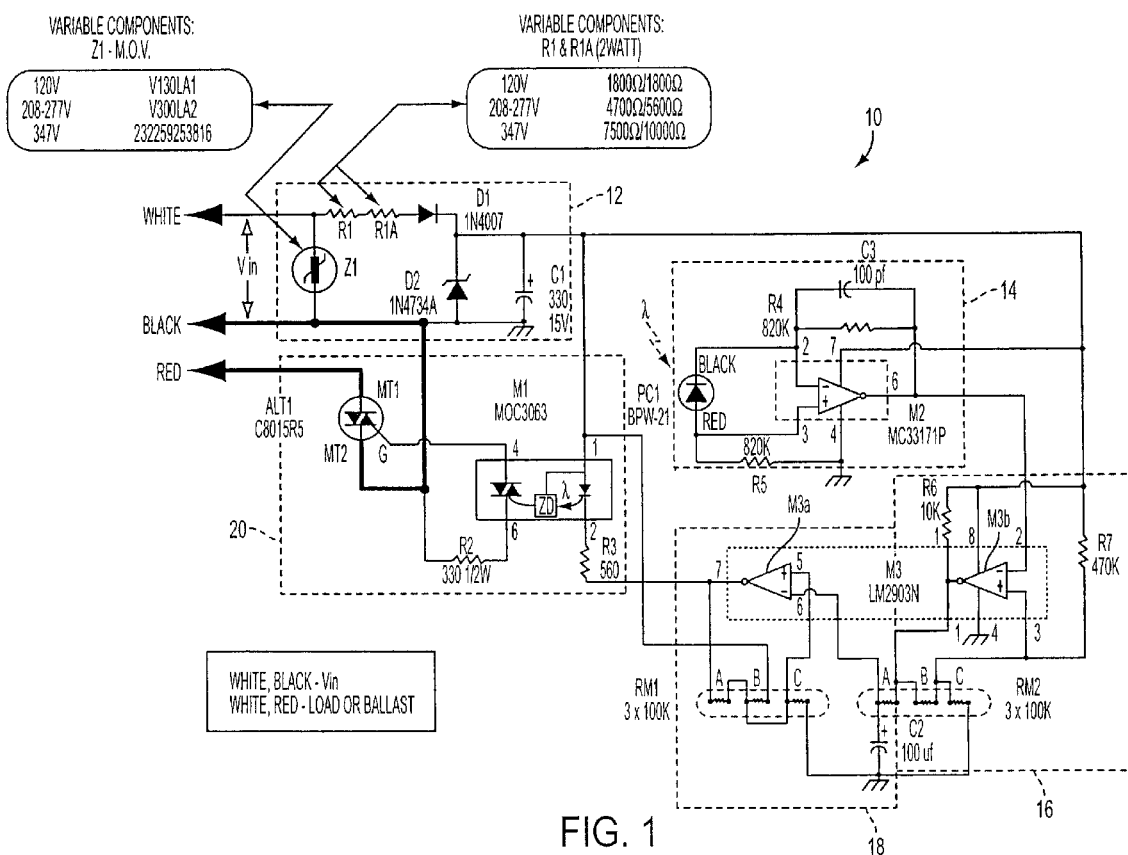
FIG. 1 is a schematic diagram of a switching circuit for use in hazardous environments constructed in accordance with an exemplary embodiment of the present invention.

A description of a photo controller circuit 10 in accordance with an exemplary embodiment of the present invention will now be provided with reference to FIG. 1. The photo controller circuit is preferably implemented to operate as described herein in high ambient temperatures and, specifically, to 90 degrees Celsius (C.) by employing electronic components rated for 125° C.

Power is provided by the power supply (PS) 12 that is preferably implemented via resistors R1 and R1A, diodes D1 and D2, capacitor C1, and Zener diode Z1. Zener diode Z1 is preferably a Metal Oxide Veristor (MOV) of appropriate value for the line voltage, thereby absorbing line transients to protect internal circuitry. Resistors R1 and R1A are preferably current limiting resistors of appropriate value for the line voltage. For example, the resistors R1 and R1A and the MOV can be selected to support 120V, 208-277V and 347V input voltages. More specifically, the power supply circuit can be provided with variable components to configure the photo controller circuit for use with 120 volt and 347 volt input voltages from the power source, as well as for special wide range circuitry handling of input voltages from 208 through 277 volts. All embodiments of the present invention preferably operate at a frequency of either 50 or 60 Hertz. A single wave, capacitor input rectifier consisting of silicon diode D1 and capacitor C1 provide filtered DC current. Zener diode D2 regulates the supply voltage to provide Vreg to the internal circuitry and a stable reference voltage for the comparators described below.

A Light to Voltage converter (LVC) 14 preferably comprises photodiode PC1, operational amplifier M2, capacitor C3, and resistors R4 and R5. Photodiode PC1 is a photodiode with an output current proportional to the incident light in its window. M2 is an operational amplifier associated with resistors R4 and R5, and forms a precision current-to-voltage converter with a transfer function $F(i)=(R5/R4) \times I_{PC1}$. Capacitor C3 stabilizes the converter 14 and prevents high frequency oscillation by shifting the possible "s" plane pole that exists in F(i) due to parasitic coupling between pin 3 and pin 6 of M2. Thus, a DC voltage appears on pin 6 of M2 that is proportional to the light on PC1 per F(i).

The Hysteresis Control (HC) circuit 16 preferably comprises a voltage comparator M3b, resistors R6 and R7 and resistors B and C of a high temperature tolerant (e.g., rated on the order of 125° C.) resistive device RM2. M3b is a voltage comparator with a + set point determined by the voltage divider R7 and resistor C of RM2 and current injected through resistor B of RM2. Resistor R6 pulls up the open collector output of M3b (i.e., at pin 1). The comparator set point is modulated by this current through resistor B, depending on the state of the comparator and thereby introducing the desired circuit hysteresis. Thus, HC circuit 16 output is determined by the light level on PCI and state before switching occurs.

The integrator/switching (IS) circuit 18 preferably comprises device M3a, resistors A of RM2, the three resistors A, B and C of a high temperature tolerant (e.g., rated on the order of 125° C.) resistive device RM1, and capacitor C2. M3a is a voltage comparator with a + set point determined by the voltage divider resistor C and resistor B of RM1 (pin 5) and current injected through resistor A of RM1. The + set point is shifted slightly by current in resistor A of RM1 and assures positive switching. Resistor A of RM2 and capacitor C2 integrate the output of the HC circuit 16 over time, thus providing a positive time delay (e.g., about 8 seconds) before M3a is able to switch states. M3a provides a current sink for the output switch's light emitting diode (LED) inside device M1 described below. Thus, the HC circuit 16 output switch is controlled by the incident light level, previous circuit state, and time. The voltage comparators M3a and M3b can be implemented as a low power, low offset voltage, dual comparator or dual differential comparator in which two independent voltage comparators are provided and designed to operate from a single power source over a wide voltage range. Such a dual comparator (e.g., model no. LM2903N) can be obtained from National Semiconductor Corporation, Santa Clara, Calif. or Fairchild Semiconductor Corporation, South Portland, Me.

The output switch (OS) circuit 20 preferably comprises optoisolator M1, resistors R2 and R3, and alternistor ALT1 (i.e., an improved triac). Optoisolator M1 is preferably a triac output optiosolater with built-in zero-crossing detector to dampen switching transients. When current sink from the IS is activated, current flows through resistor R3 forward biasing the LED inside M1. This light hits a light sensitive triac inside of optoisolator M1. The zero-crossing detector senses the AC voltage for zero voltage. At this time, it latches the triac inside of M1 and allows AC current to flow through R2 into the gate (G) of ALT1. This current allows AC line currant to flow into terminal 1 of ALT1 (BLACK lead) and out of terminal 2 and through the load (RED lead). Thus, switching occurs between the RED and BLACK leads determined by incident light level, previous circuit state, and time after initiation of the state changes.

A description of the circuit function of an exemplary embodiment of the present invention will now be provided.

Assume the initial light level is high and OS circuit 20 was inactive (i.e., lamp out). When the incident light drops below about 2 foot candles (fc), voltage from the LVC 14 on M3*b* (pin 2) drops below the + set level on M3*b* (pin 3), and M3*b* (pin 1) goes high. Current from the HC circuit 16 charges C2 through resistor A of RM2 and, after a time delay, the – level voltage on the IS circuit 18 (i.e., M3*a*, pin 6) rises above the + level on pin 5, and M3*a* pin 7 is set low. Resistor A of RM1 assures positive switching. Current flows through R3, and the OS circuit 20 is activated, turning on the load (i.e., lighting fixture or globe). Thus, the globe is turned on when the light drops below about 2 fc after time delay, if the IS circuit 18 was previously off. The photo controller unit 10 of the present invention ignores this transition if the IS circuit 18 was previously on.

Now assume the light level rises, with the OS circuit 20 still active (i.e., the lighting fixture or globe is on). When the incident light rises above about 10 fc, voltage from the LVC on M3*b* (pin 2) rises above the + set point on M3*b* (pin 3), which is higher now due to the HC circuit 16. M3*b* pin 1 goes low, and current from the HC circuit 16 discharges C2 through resistor A or RM2 and (i.e., after a time delay) the – level voltage on the IS circuit 18 (M3*a*, pin 6) drops below the + set point on pin 5, and M3*a* pin 7 is set high.

Current through R3 ceases (i.e., since the LED in M1 is no longer forward biased) and the OS circuit 20 deactivates, thereby turning off the globe. Thus, the globe is turned off when the light rises above about 10 fc after the time delay, if the IS circuit 18 was previously on. The photo controller unit 10 ignores this transition if the IS circuit 18 was previously off.

Thus, exemplary embodiments of the present invention permit a photocell switching circuit to be relatively inexpensive to produce and useful in hazardous locations with high temperature operating conditions. Because of the simplicity with which the photocell switching circuit can be housed into a single unit enclosure means, overall complexity is reduced, thus further reducing production costs. The elimination of electro-mechanical relays avoids susceptibility to arcing or sparking, and permits a much simpler technique to be used for housing the circuit in an environmentally safe enclosure means (e.g., using a thermoplastic casing and epoxy). By contrast, such epoxy packaging techniques cannot be used in conjunction with electro-mechanical relays that employ moving parts (i.e., the liquid epoxy would solidify about the electro-mechanical relay and inhibit movement of the contacts). The hysteresis control and integrator and switching circuits facilitate prevent of errant or undesirable switching on or off of the load.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A photo controller circuit comprising:
   an output switching (OS) circuit comprising an alternistor for controllably completing and interrupting a power supply path between a power source and a load, and an optoisolator connected to the power source and to the alternistor for controllably gating the alternistor;
   a light to voltage converter (LVC) circuit for detecting incident light and generating a direct current (DC) voltage proportional to the detected incident light;
   a hysteresis control (HC) circuit comprising a voltage comparator for generating an output depending on the DC voltage and the state of the OS circuit, the state of the OS circuit being one of active to power on the load and inactive to power down the load; and
   an intermediate switching (IS) circuit operable to controllably turn on and provide current to activate the optoisolator when the output of the HC circuit indicates the detected incident light is below a first selected level and the IS circuit was off, and to controllably turn off and reduce the current to deactivate the optoisolator when the output of the HC circuit indicates the detected incident light is above a second selected level and the IS circuit was on.

2. A photo controller circuit as claimed in claim 1, wherein the IS circuit ignores the output of the HC circuit and remains on when the output of the HC circuit indicates the detected incident light is below the first selected level and the IS circuit was on, and ignores the output of the HC circuit and remains off when the output of the HC circuit indicates the detected incident light is above the second selected level and the IS circuit was off.

3. A photo controller circuit as claimed in claim 1, wherein the first selected level is approximately two foot candles, and the second selected level is approximately 10 foot candles.

4. A photo controller circuit as claimed in claim 1, wherein the optoisolator is a triac output optoisolator having a light sensitive triac and light emitting diode (LED), wherein the current from the IS circuit forward biases the LED, and the light sensitive triac allows AC current to flow to the alternistor when it detects light from the LED and actuates.

5. A photo controller circuit as claimed in claim 4, wherein the optoisolator has a zero-crossing detector that actuates the light sensitive triac when zero-crossing of an AC voltage input from the power source is detected.

6. A photo controller circuit as claimed in claim 1, wherein the optoisolator has a zero-crossing detector that actuates the optoisolator when zero-crossing of an AC voltage input from the power source is detected.

7. A photo controller circuit as claimed in claim 1, wherein the voltage comparator in the HC circuit has a set point and is operable to compare the DC voltage with the set point, the set point varying depending on the state of the voltage comparator.

8. A photo controller circuit as claimed in claim 1, further comprising a power supply circuit connected to the power source and configured to provide a regulated voltage to at least one of the OS circuit, the LVC circuit, the HC circuit, and the IS circuit, the power supply circuit comprising variable components to configure the photo controller circuit for use with a selected one of 120 volt, 208 through 277 volt and 347 volt input voltages from the power source.

9. A photo controller circuit as claimed in claim 1, the IS circuit being configured to provide a selected time delay to the output of the HC circuit prior to generating the current to activate the optoisolator and prior to reducing the current to deactivate the optoisolator.

10. A photo controller circuit as claimed in claim 1, wherein the OS circuit, LVC circuit, HC circuit and the IS circuit employ electronic components rated for 125 degrees Celsius.

11. A photo controller circuit comprising:
    an output switching (OS) circuit comprising an alternistor for controllably completing and interrupting a power supply path between a power source and a load, and an optoisolator connected to the power source and to the alternistor for controllably gating the alternistor;
    a light to voltage converter (LVC) circuit for detecting incident light and generating a direct current (DC) voltage proportional to the detected incident light;
    a hysteresis control (HC) circuit comprising a voltage comparator for generating an output depending on the DC voltage and the state of the OS circuit, the state of the OS circuit being one of active to power on the load and inactive to power down the load; and
    an integrator and switching (IS) circuit operable to controllably turn on and provide current to activate the optoisolator when the output of the HC circuit indicates the detected incident light is below a first selected level and the IS circuit was off, and to controllably turn off and reduce the current to deactivate the optoisolator when the output of the HC circuit indicates the detected incident light is above a second selected level and the IS circuit was on, the IS circuit being configured to provide a selected time delay to the output of the HC circuit prior to generating the current to activate the optoisolator and prior to reducing the current to deactivate the optoisolator.

12. A photo controller circuit as claimed in claim 11, wherein the IS circuit ignores the output of the HC circuit and remains on when the output of the HC circuit indicates the detected incident light is below the first selected level and the IS circuit was on, and ignores the output of the HC circuit and remains off when the output of the HC circuit indicates the detected incident light is above the second selected level and the IS circuit was off.

13. A photo controller circuit as claimed in claim 11, wherein the first selected level is approximately two foot candles, and the second selected level is approximately 10 foot candles.

14. A photo controller circuit as claimed in claim 11, wherein the optoisolator is a triac output optoisolator having a light sensitive triac and light emitting diode (LED), wherein the current from the IS circuit forward biases the LED, and the light sensitive triac allows AC current to flow to the alternistor when it detects light from the LED and actuates.

15. A photo controller circuit as claimed in claim 14, wherein the optoisolator has a zero-crossing detector that actuates the light sensitive triac when zero crossing of an AC voltage input from the power source is detected.

16. A photo controller circuit as claimed in claim 11, wherein the optoisolator has a zero-crossing detector that actuates the optoisolator when zero crossing of an AC voltage input from the power source is detected.

17. A photo controller circuit as claimed in claim 11, wherein the voltage comparator in the HC circuit has a set point and is operable to compare the DC voltage with the set point, the set point varying depending on the state of the voltage comparator.

18. A photo controller circuit as claimed in claim 11, further comprising a power supply circuit connected to the power source and configured to provide a regulated voltage to at least one of the OS circuit, the LVC circuit, the HC circuit, and the IS circuit, the power supply circuit comprising variable components to configure the photo controller circuit for use with 120 volt, 208 through 277 volt, and 347 volt input voltages from the power source.

19. A photo controller circuit as claimed in claim 11, wherein the OS circuit, LVC circuit, HC circuit and the IS circuit employ electronic components rated for 125 degrees Celsius.

20. A method of photo-controlled switching of a load comprising the steps of:
    controllably operating a output switching circuit to selectively complete and interrupt a power supply path between a power source and a load;
    detecting incident light and generating a direct current (DC) voltage proportional to the detected incident light;
    generating an output signal depending on the DC voltage and the state of the OS circuit to indicate when the incident light is above and below selected thresholds, the state of the OS circuit being one of active to power on the load and inactive to power down the load;
    operating a time delay and activating circuit to controllably turn on and activate the output switching circuit when the output signal indicates the detected incident light is below a selected threshold and the time delay and activating circuit was off, and to controllably turn off and deactivate the output switching circuit when the output signal indicates the detected incident light is above a selected threshold and the time delay and activating circuit was on; and
    providing a selected time delay to the output signal via the time delay and activating circuit prior to activating the output switching circuit and prior to deactivating the output switching circuit.

21. A method as claimed in claim 20, wherein the time delay and activating circuit ignores the output signal and remains on when the output signal indicates the detected incident light is below a first selected threshold and the time delay and activating circuit was on, and ignores the output signal and remains off when the output signal indicates the detected incident light is above a second selected threshold and the time delay and activating circuit was off.

22. A method as claimed in claim 21, wherein the first selected threshold is approximately two foot candles, and the second selected threshold is approximately 10 foot candles.

23. A method as claimed in claim 20, wherein the output switching circuit comprises an alternistor and a triac output optoisolator having a light sensitive triac and light emitting diode (LED), and the operating step for operating the time delay and activating circuit comprises the steps of:
    forward biasing the LED; and actuating the light sensitive triac to allow AC current to flow to the alternistor when the optoisolator detects light from the LED and actuates.

24. A method as claimed in claim 23, wherein the optoisolator has a zero-crossing detector and further comprising the step of actuating the light sensitive triac when zero crossing of an AC voltage input from the power source is detected.

25. A method as claimed in claim 20, wherein the optoisolator has a zero-crossing detector and further comprising the step of actuating the optoisolator when zero crossing of an AC voltage input from the power source is detected.

* * * * *